(12) United States Patent
Gai et al.

(10) Patent No.: US 9,679,520 B2
(45) Date of Patent: Jun. 13, 2017

(54) ARRAY SUBSTRATE, METHOD OF PRODUCING THE SAME, AND DISPLAY APPARATUS

(71) Applicant: BOE TECHNOLOGY GROUP CO., LTD., Beijing (CN)

(72) Inventors: Cuili Gai, Beijing (CN); Danna Song, Beijing (CN); Zhongyuan Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 14/769,086

(22) PCT Filed: Dec. 19, 2014

(86) PCT No.: PCT/CN2014/094385
§ 371 (c)(1),
(2) Date: Aug. 19, 2015

(87) PCT Pub. No.: WO2016/041283
PCT Pub. Date: Mar. 24, 2016

(65) Prior Publication Data
US 2016/0253967 A1 Sep. 1, 2016

(30) Foreign Application Priority Data

Sep. 18, 2014 (CN) .......................... 2014 1 0478775

(51) Int. Cl.
*G09G 3/36* (2006.01)
*G09G 3/3266* (2016.01)
(Continued)

(52) U.S. Cl.
CPC ............. *G09G 3/3266* (2013.01); *G09G 3/20* (2013.01); *H01L 23/50* (2013.01);
(Continued)

(58) Field of Classification Search
None
See application file for complete search history.

(56) References Cited

U.S. PATENT DOCUMENTS

2012/0313907 A1 12/2012 Yamazaki et al.
2016/0293128 A1* 10/2016 Kawamura ......... G02F 1/13452

FOREIGN PATENT DOCUMENTS

CN 101487962 A 7/2009
CN 202256947 U 5/2012
(Continued)

OTHER PUBLICATIONS

International Search Report and Written Opinion from PCT Application Serial No. PCT/CN2014/094385, dated Mar. 13, 2015, 11 pages.
(Continued)

*Primary Examiner* — Joseph Haley
(74) *Attorney, Agent, or Firm* — Kinney & Lange, P.A.

(57) ABSTRACT

The present disclosure provides an array substrate, a method of producing the same and a display apparatus. The array substrate comprises: N rows of scan lines, N being a natural number; M columns of data lines, which are arranged to cross with the N rows of scan lines, M being a natural number; a display array comprising N×M pixel units defined by the N rows of scan lines and the M columns of data lines; and N columns of leading wires electrically connected to the N rows of scan lines respectively and led out in parallel to the M columns of data lines. It may narrow the frame of the display apparatus.

11 Claims, 2 Drawing Sheets

(51) Int. Cl.
  *H01L 23/50* (2006.01)
  *G09G 3/20* (2006.01)
  *H01L 27/32* (2006.01)
(52) U.S. Cl.
  CPC . *H01L 27/3276* (2013.01); *G09G 2300/0408* (2013.01); *G09G 2300/0426* (2013.01); *G09G 2300/08* (2013.01); *H01L 2251/5315* (2013.01); *H01L 2924/0002* (2013.01)

(56) References Cited

FOREIGN PATENT DOCUMENTS

| CN | 102629053 A | 8/2012 |
| CN | 202421684 U | 9/2012 |
| CN | 102890380 A | 1/2013 |
| CN | 202816944 U | 3/2013 |
| CN | 103578443 A | 2/2014 |

OTHER PUBLICATIONS

First Chinese Office Action dated Jul. 28, 2016, for corresponding Chinese Application No. 201410478775.X.

\* cited by examiner

US 9,679,520 B2

ARRAY SUBSTRATE, METHOD OF PRODUCING THE SAME, AND DISPLAY APPARATUS

BACKGROUND

Field of the Disclosure

The present disclosure relates to display technical field, and in particular, to an array substrate, a method of producing the same and a display apparatus.

Description of the Related Art

In recent years, an organic light emitting diode (OLED) becomes a very popular and new flat panel display product all over the world. It has properties of such as self-emission, wide view, short response time, high light emitting efficiency, wide color range, low work voltage, thin panel, manufacturability for high size and flexible panel and simple production process. And its cost may further be reduced in the future.

The OLED is made of N×M (N and M are both natural numbers) light emitting pixel units in a matrix arrangement. For a colored OLED, each of the light emitting pixel units may include a red sub-pixel unit, a green sub-pixel unit and a blue sub-pixel unit. The OLED is classified into an active-matrix OLED (AMOLED) and a passive-matrix OLED (PMOLED) on the basis of its driving mode.

FIG. 1 shows schematically a structure of the conventional AMOLED display module. As illustrated in FIG. 1, it includes an OLED display array 101, a scan driving chip 102, a signal driving chip 103, scan lines 104 connecting the OLED display array 101 with the scan driving chip 102, and data lines 105 connecting the OLED display array 101 with the signal driving chip. The OLED display array 101 is composed of rows and columns of sub-pixel units 106. The scan lines 104 and the data lines 105 are connected to respective sub-pixel units 106 of the OLED display array in rows and columns, respectively. The conventional OLED display module must occupy larger spaces on two sides of the OLED display as the scan lines 104 are led from two sides of the OLED display respectively. In this way, wider non-emissive regions are formed on the two sides of the OLED display module, which may degrade the display effects.

SUMMARY OF THE DISCLOSURE

In view of the above problem in the prior art, the present disclosure provides an array substrate, a method for producing the same and a display apparatus.

An embodiment of the present invention provides an array substrate, comprising:

N rows of scan lines, N being a natural number;

M columns of data lines, which are arranged to cross with the N rows of scan lines, M being a natural number;

a display array comprising N×M pixel units defined by the N rows of scan lines and the M columns of data lines; and N columns of leading wires electrically connected to the N rows of scan lines respectively and led out in parallel to the M columns of data lines.

In an embodiment, contact holes are provided above the N rows of scan lines respectively and the N columns of leading wires are electrically connected to the N rows of scan lines via the contact holes, respectively.

In an embodiment, the N columns of leading wires and the M columns of data lines are arranged in the same layer.

In an embodiment, each column of the N columns of leading wires is located between two adjacent columns of data lines and each two columns of the N columns of leading wires have a constant interval between them.

In an embodiment, the $\lceil N/2 \rceil^{th}$ or $\lfloor N/2 \rfloor^{th}$ column of the N columns of leading wires is located between the central two columns of data lines in the M columns of data lines and electrically connected to the first row of scan line and other columns of leading wires on two sides of the $\lceil N/2 \rceil^{th}$ or $\lfloor N/2 \rfloor^{th}$ column are electrically connected to the second to $N^{th}$ rows of scan lines alternatively in sequence, respectively.

In an embodiment, the first column of the N columns of leading wires is located between two columns of data lines on one side of the M columns of data lines and electrically connected to the first row of scan lines, and the second to $N^{th}$ columns of leading wires are connected to the second to $N^{th}$ rows of scan lines in sequence, respectively; or the $N^{th}$ column of the N columns of leading wires is located between two columns of data lines on the other side of the M columns of data lines and electrically connected to the first row of scan line, and the $(N-1)^{th}$ to first columns of leading wires are connected to the second to $N^{th}$ rows of scan lines in sequence, respectively.

In an embodiment, the N columns of leading wires are made from a metal material.

In an embodiment, the array substrate further comprises: a signal driving chip and a scan driving chip, wherein the signal driving chip is connected to the display array by the M columns of data lines and the scan driving chip is connected to the display array by the N columns of leading wires and the N rows of scan lines.

In an embodiment, the signal driving chip and the scan driving chip are located on the same side of the display array.

An embodiment of the present invention also provides a display apparatus comprising the array substrate as described in any one of the above embodiments.

In an embodiment, the display apparatus is a top emitting type OLED display apparatus.

An embodiment of the present invention also provides a method for producing an array substrate, comprising:

forming a first electrically conductive layer and patterning it to form N rows of scan lines, N being a natural number;

forming an insulation layer and forming N contact holes in the insulation layer, the N contact holes being located above the N rows of scan lines respectively;

forming a second electrically conductive layer and patterning it to form M columns of data lines and N columns of leading wires arranged to cross with each other and to define N×M pixel units, the N columns of leading wires being led out from the N contact holes respectively, and in parallel to the M columns of data lines, wherein M is a natural number.

In the above embodiments of the present invention, the N columns of leading wires are provided and the scan lines and the data lines are led out in parallel through the contract holes above the scan lines. In this way, the scan driving chip and the signal driving chip may be arranged on the same side of the display array without occupying the spaces on two sides of the display apparatus to narrow the frame of the display apparatus.

DETAILED DESCRIPTION OF THE PREFERRED EMBODIMENTS

In order that objects, solutions and advantages of the present disclosure will become more apparent and explicit, the embodiments will be described hereinafter in detail with reference to the accompanied drawings.

In addition, in the following detailed description, details of embodiments are expounded concretely for explanation. However, it is noted that one or more embodiments may be implemented without explanations in details by those skilled in the art. In any other case, the known structures and devices are shown schematically to simplify the accompanying drawings.

In accordance with the general inventive concept of the present disclosure, it provides an array substrate, comprising: N rows of scan lines, N being a natural number; M columns of data lines, which are arranged to cross with the N rows of scan lines, M being a natural number; a display array comprising N×M pixel units defined by the N rows of scan lines and the M columns of data lines; and N columns of leading wires electrically connected to the N rows of scan lines respectively and led in parallel to the M columns of data lines.

Figure 1:
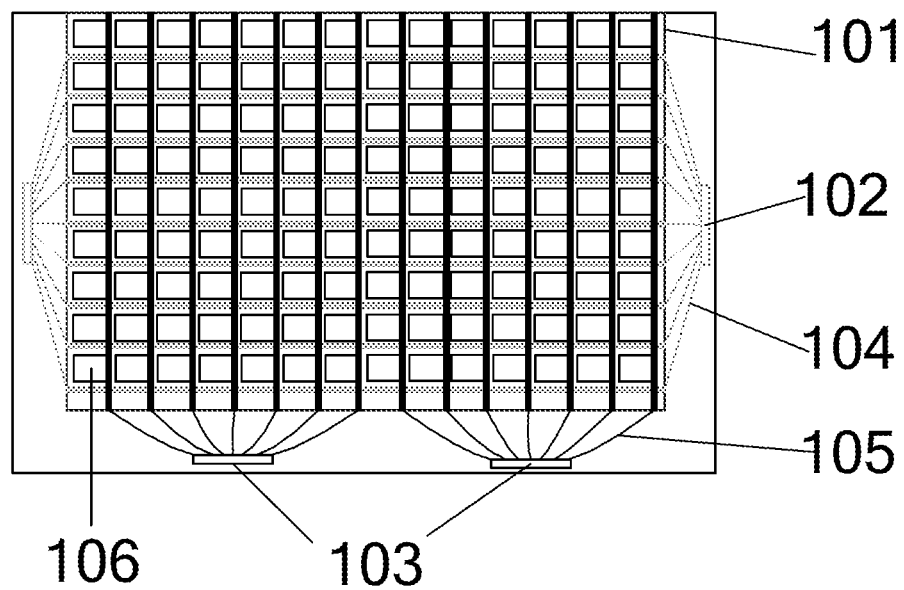
FIG. 1 shows schematically a structure of AMOLED display module in the prior art.
Figure 2:
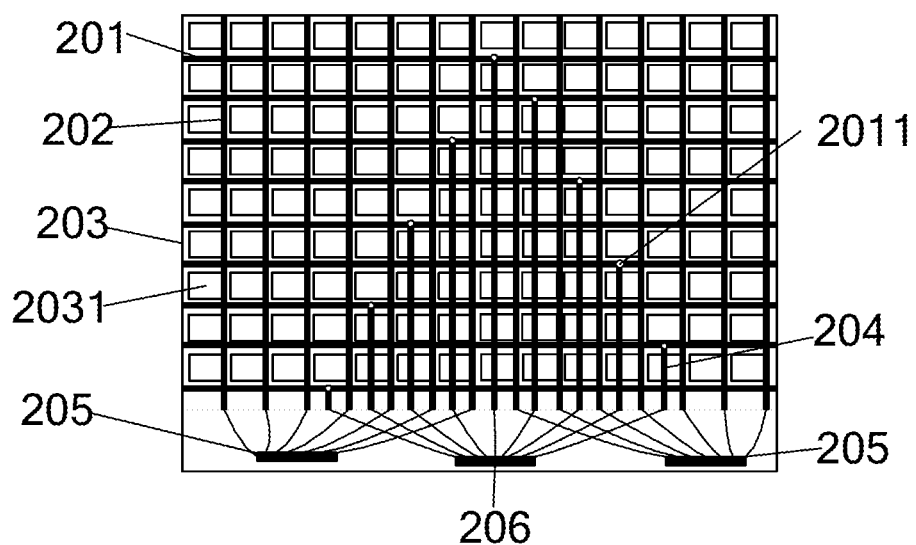
FIG. 2 shows schematically a structure of an array substrate according to an embodiment of the present invention.

FIG. 2 shows schematically a structure of an array substrate according to an embodiment of the present invention. As illustrated in FIG. 2, the array substrate includes:

N rows of scan lines 201;

M columns of data lines 202, which are arranged to cross with the N rows of scan lines 201;

a display array 203 comprising N×M pixel units 2031 defined by the N rows of scan lines 201 and the M columns of data lines 202, M and N both being natural numbers; and N columns of leading wires 204 electrically connected to the N rows of scan lines respectively and led in parallel to the M columns of data lines 203.

In an example, a contact hole 2011 is provided above each of the N rows of scan lines 201. The N columns of leading wires 204 contact electrically with the N rows of scan lines 201 via the contact holes 2011, respectively.

As an example, the N columns of leading wires 204 may be made from electrically conductive materials such as metal, alloy materials.

In an example, the N columns of leading wires 204 and the M columns of data lines 202 may be made from the same material and be arranged in the same layer.

In an example, the N columns of leading wires 204 may be led vertically from one side (it is the bottom side shown in FIG. 2) of the display array 203.

As an example, the array substrate may further include a signal driving chip 205 and a scan driving chip 206. The signal driving chip 205 is connected to the display array 203 by the M columns of data lines 202 to provide data signals to the display array 203. The scan driving chip 206 is connected to the N rows of scan lines 201 by the N columns of leading wires 204, and in turn connected to the display array 203 to provide scan signals to the display array 203.

The signal driving chip 205 and the scan driving chip 206 may be located on one side (it is the bottom side shown in FIG. 2) of the display array. In this way, the M columns of data lines 202 and the N columns of leading wires 204 may be led vertically in parallel from the bottom side of the display array 203 without occupying the spaces on other two sides (they are left and right sides shown in FIG. 2), which contributes to narrowing the frame of the display apparatus.

In addition, the specific positions of the contact holes 2011 above the scan lines 201 may be set as actually required. On one aspect, it will be considered whether addition of the leading wires 204 may disturb the display on the display screen, that is, whether it may shield a light ray. On the other aspect, the distance from the scan lines 201 to the scan driving chip 206 via the leading wires 204 will also be considered. If the respective distances from the scan driving chip 206 to the respective scan lines are excessively different from each other, a too large difference among the respective electrical resistivity from the scan driving chip 206 to the respective scan lines 201 will occur, and thereby, scan signals transferred to the respective scan lines will become unstable.

For the above first aspect, as an example, the contact holes 2011 may be arranged between two adjacent columns of data lines. Each column of the leading wires 204 is located between two adjacent columns of data lines. Each two columns of the N columns of leading wires have a constant interval between them. In this way, it may prevent the contact holes 2011 from being arranged in display areas of the pixel units 2031.

For the second aspect, as an example, as illustrated in FIG. 2, the N columns of leading wires 204 may be arranged in a first arrangement mode as follows:

the $\lceil N/2 \rceil^{th}$ or $\lfloor N/2 \rfloor^{th}$ column of the N columns of leading wires is located between the central two columns of data lines in the M columns of data lines and electrically connected to the first row of scan line and other columns of leading wires on two sides (such as leading wires on left and right sides) of the $\lceil N/2 \rceil^{th}$ or $\lfloor N/2 \rfloor^{th}$ column are electrically connected to the second to $N^{th}$ rows of scan lines alternatively in sequence, respectively. In such arrangement, the $\lceil N/2 \rceil^{th}$ or $\lfloor N/2 \rfloor^{th}$ column of the N columns of leading wires is longest and other leading wires on its two sides becomes short in sequence to form a semi-elliptical distribution. In this way, the scan driving chip 206 may be arranged in middle position on one side of the display array 203 (it is the bottom side shown in FIG. 2), i.e., it is located just below the $\lceil N/2 \rceil^{th}$ or $\lfloor N/2 \rfloor^{th}$ column of leading wires. Thus, there is the shortest distance between the $\lceil N/2 \rceil^{th}$ or $\lfloor N/2 \rfloor^{th}$ column of leading wire and the scan driving chip 206, and the distances between other leading wires on its two sides and the scan driving chip 206 become increased in sequence. Therefore, the difference among the distances between the scan driving chip 206 and the respective rows of scan lines may be reduced to avoid too large difference in electrical resistivity.

As an example, a second arrangement mode may also be used as follows:

the first column of the N columns of leading wires is located between two columns of data lines on one side (for example left side) of the M columns of data lines and electrically connected to the first row of scan line, and the second to $N^{th}$ rows of leading wires are connected to the second to $N^{th}$ rows of scan lines in sequence, respectively. In such arrangement, the first column of leading wire has the largest length and other leading wires on the right side become short in sequence to form a quarter of sector distribution. In such arrangement, the scan driving chip 206 may be arranged on the left side below the display array 203, that is, located just below the first column of leading wire. In this way, the distance between the first column of leading wire and the scan driving chip 206 becomes shortest and the distances between the other leading wires on its right side and the scan driving chip 206 become increased in sequence. Therefore, the difference among the distances between the scan driving chip 206 and the respective rows of scan lines may be reduced to avoid too large difference in electrical resistivity.

As an example, the third arrangement mode may also be used as follows:

the $N^{th}$ column of the N columns of leading wires is located between two columns of data lines on the other side (for example, the right side) of the M columns of data lines and electrically connected to the first row of scan line, and the $(N-1)^{th}$ to second columns of leading wires are connected to the second to $N^{th}$ rows of scan lines in sequence, respectively. In such arrangement, the $N^{th}$ column of leading wire has the largest length and other leading wires on the left side become short in sequence to form a quarter of sector distribution. In such arrangement, the scan driving chip 206 may be arranged on the right side below the display array 203, that is, located just below the first column of leading wire. In this way, the distance between the first column of leading wire and the scan driving chip 206 becomes shortest and the distances between the other leading wires on its left side and the scan driving chip 206 become increased in sequence. Therefore, the difference among the distances between the scan driving chip 206 and the respective rows of scan lines may be reduced to avoid too large difference in electrical resistivity.

The above array substrate provided by the present disclosure is in particular suitable for a top emitting type OLED display apparatus. For the top emitting type OLED display apparatus, as a light emitting layer of an OLED device is located above the array substrate and the light is emitted from above the array substrate without passing through the array substrate, the aperture opening ratio will not be degraded even if additional N columns of leading wires are led from the array substrate.

Certainly, for other types of display apparatuses, such as LCD display apparatus or bottom emitting type OLED display apparatus, the array substrate provided by the embodiments of the present invention that does not degrade the display also be achieved as long as the leading wires are arranged reasonably or the light emitting efficiency of a backlight source and sub-pixel light emitting units are adjusted accordingly.

An embodiment of the present invention also provides a display apparatus including the array substrate as described in any one of the above embodiments. For example, the display apparatus may be the top emitting type OLED display apparatus.

Figure 3:
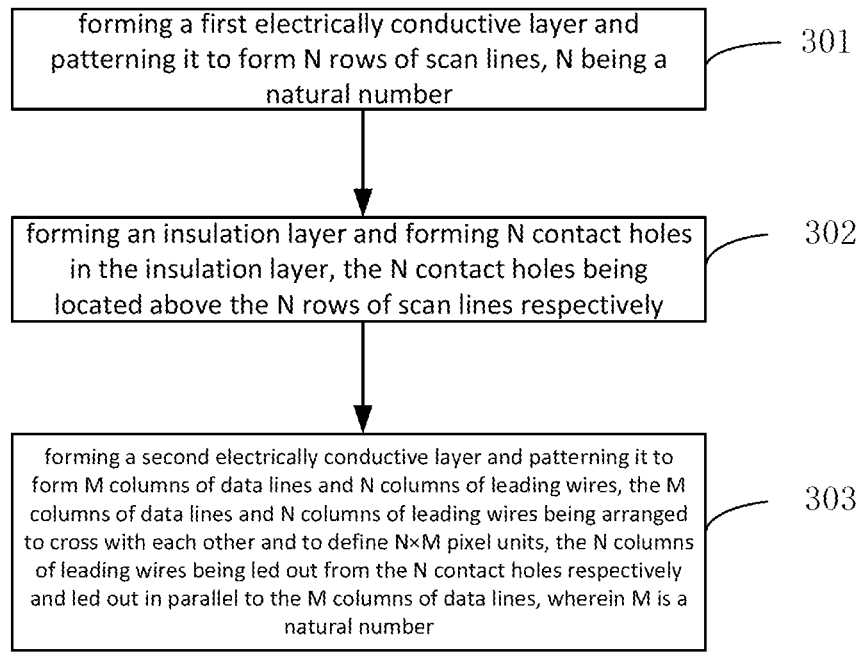
FIG. 3 is a flow chart of a method for producing the array substrate according to an embodiment of the present invention.

FIG. 3 shows a flow chart of a method for producing an array substrate in accordance with an embodiment of the present invention. As illustrated in FIG. 3, the method includes:

Step 301 of: forming a first electrically conductive layer (for example a gate layer) and patterning it to form N rows of scan lines, N being a natural number;

Step 302 of: forming an insulation layer and forming N contact holes in the insulation layer, the N contact holes being located above the N rows of scan lines respectively;

Step 303 of: forming a second electrically conductive layer (for example a source and drain layer) and patterning it to form M columns of data lines and N columns of leading wires, the M columns of data lines and N columns of leading wires being arranged to cross with each other and to define N×M pixel units, the N columns of leading wires being led out from the N contact holes respectively and led out parallel to the M columns of data lines, wherein M is a natural number.

In the example, the N×M pixel units define a display area and the M columns of data lines and the N columns of leading wires are led out from one side (for example, it is the bottom side shown in FIG. 2) of the display area.

The first electrically conductive layer (for example the gate layer) and the second electrically conductive layer (for example the source and drain layer) may be made from metal or other electrically conductive materials. The metal includes Mo, Pt, Al, Ti, Co, Au, Cu, or the like.

As an example, in the Step 301, patterning the first electrically conductive layer further includes forming gate electrodes of the respective pixel units, the gate electrodes being electrically connected to the scan lines.

As an example, in the Step 303, patterning the second electrically conductive layer further includes forming source electrodes and drain electrodes of the respective pixel units.

Figure 4:
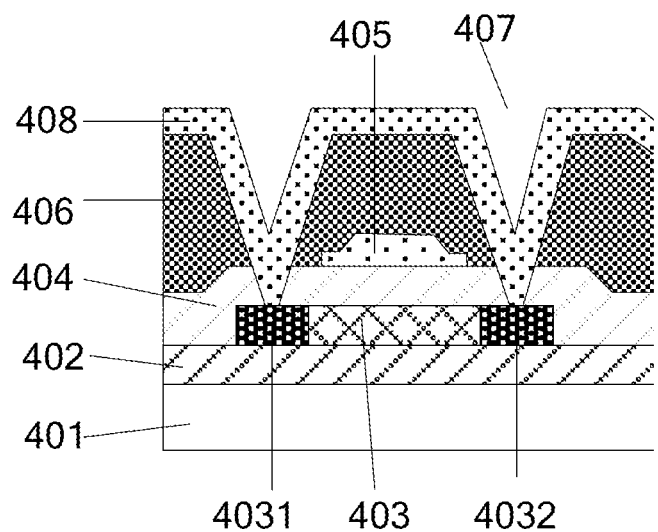
FIG. 4 shows schematically a structure of an array substrate produced by the method according to an embodiment of the present invention.

FIG. 4 shows schematically a local structure of an array substrate produced by the method according to an embodiment of the present invention. In the embodiment, the method includes:

forming a buffer layer 402 on a glass substrate 401 and forming an active layer on the buffer layer 402;

patterning the active layer to form an active channel 403 and forming a doped source area 4031 and a drain area 4032 on two sides of the active channel 403, the doped source area 4031 and drain area 4032 on two sides of the active channel 403 being electrically conductive;

forming a first insulation layer 404;

forming a gate layer and patterning it to form gate electrodes 405 and N horizontally parallel scan lines (not shown), N being a natural number;

forming a second insulation layer 406 and patterning it to form N first contact holes (not shown) located above the N rows of scan lines respectively and a plurality of second contact holes 407 located in the doped source area S and drain area D respectively;

forming a source and drain layer 408 and patterning it to form source electrodes, drain electrodes, M data lines that are parallel to each other and are perpendicular to the scan lines, and N leading wires (not shown) that are parallel to each other and are perpendicular to the scan lines. The source electrodes and the drain electrodes contact electrically with the doped source area 4031 and drain area 4032 through the second contact holes respectively. The M data lines are arranged to cross with the N scan lines to define N×M pixel units.

In the example, the N×M pixel units define a display area. The N leading wires are led out from the N first contact holes and led out from the display area parallel to the M data lines, that is, they are led to the same side of the display area (for example, the bottom side shown in FIG. 2).

In the above embodiments of the present invention, the N leading wires are provided and the scan lines and the data lines are led out in parallel through the contract holes above the scan lines. In this way, the scan driving chip and the signal driving chip may be arranged on the same side of the display array without occupying the spaces on two sides of the display apparatus to narrow the frame of the display apparatus. The above embodiments of the present invention are in particular suitable for the top emitting type OLED devices. As the N leading wires are located below the light emitting layer, the aperture opening ratio of the display pixels will not be degraded.

The objects, solutions and advantageous effects of the present disclosure have been described in details with reference to the above specific embodiments. It should be understood that the above embodiments are given only by ways of examples instead of limiting the present invention. Any changes, equivalent replacement, modification within the spirit and principles of the disclosure can be made by those skilled in the art and should fall into the scope of the present invention.

The invention claimed is:

1. An array substrate, comprising:
N rows of scan lines, N being a natural number;
M columns of data lines, which are arranged to cross with the N rows of scan lines, M being a natural number;
a display array, comprising N×M pixel units defined by the N rows of scan lines and the M columns of data lines; and
N columns of leading wires, electrically connected to the N rows of scan lines respectively and led out in parallel to the M columns of data lines,
wherein each column of the N columns of leading wires is located between two adjacent columns of data lines and there is a constant interval between each two columns of the N columns of leading wires; and
wherein:
the $\lceil N/2 \rceil^{th}$ column or the $\lfloor N/2 \rfloor^{th}$ column of the N columns of leading wires is located between two central columns of data lines in the M columns of data lines and electrically connected to a first row of the scan lines, and other leading wires on two sides of the $\lceil N/2 \rceil^{th}$ column or the $\lfloor N/2 \rfloor^{th}$ column of the N columns of leading wires are electrically connected to second through $N^{th}$ rows of the scan lines alternatively in sequence, respectively, wherein $\lceil N/2 \rceil$ represents a ceiling function that is equal to the mathematical result of N divided by 2 in a case that N is an even number and is equal to the first integer greater than the mathematical result of N divided by 2 in a case that N is an odd number, and $\lfloor N/2 \rfloor$ represents a floor function that is equal to the mathematical result of N divided by 2 in the case that N is an even number and is equal to the first integer smaller than the mathematical result of N divided by 2 in the case that N is an odd number; or
a first column of the N columns of leading wires is located between two columns of data lines on a first side of the M columns of data lines and electrically connected to a first row of the scan lines, and second through $N^{th}$ columns of the N columns of leading wires are connected to second through $N^{th}$ rows of the scan lines in sequence, respectively; or
an $N^{th}$ column of the N columns of leading wires is located between two columns of data lines on a second side of the M columns of data lines and electrically connected to the first row of the scan lines, and the $(N-1)^{th}$ through first columns of the N columns of leading wires are connected to the second to through $N^{th}$ rows of the scan lines in sequence, respectively.

2. The array substrate according to claim 1, wherein contact holes are provided above the N rows of scan lines respectively and the N columns of leading wires are electrically connected to the N rows of scan lines via the contact holes, respectively.

3. The array substrate according to claim 1, wherein the N columns of leading wires are made from a metal material.

4. The array substrate according to claim 1, further comprising: a signal driving chip and a scan driving chip, wherein the signal driving chip is connected to the display array by the M columns of data lines and the scan driving chip is connected to the display array by the N columns of leading wires and the N rows of scan lines.

5. The array substrate according to claim 4, wherein the signal driving chip and the scan driving chip are located on a same side of the display array.

6. A display apparatus comprising an array substrate according to claim 1, the array substrate comprising:
N rows of scan lines, N being a natural number;
M columns of data lines, which are arranged to cross with the N rows of scan lines, M being a natural number;
a display array, comprising N×M pixel units defined by the N rows of scan lines and the M columns of data lines; and
N columns of leading wires, electrically connected to the N rows of scan lines respectively and led out in parallel to the M columns of data lines,
wherein the N columns of leading wires and the M columns of data lines are arranged in a common layer.

7. The display apparatus according to claim 6, wherein the display apparatus is a top emitting type OLED display apparatus.

8. A method for producing an array substrate, comprising:
forming a first electrically conductive layer and patterning it to form N rows of scan lines, N being a natural number;
forming an insulation layer and forming N contact holes in the insulation layer, the N contact holes being located above the N rows of scan lines respectively; and
forming a second electrically conductive layer and patterning it to form M columns of data lines and N columns of leading wires arranged to cross with each other and to define N×M pixel units, the N columns of leading wires being led out from the N contact holes respectively, and in parallel to the M columns of data lines, wherein M is a natural number, wherein each column of the N columns of leading wires is located between two adjacent columns of data lines and there is a constant interval between each two columns of the N columns of leading wires;
wherein:
the $\lceil N/2 \rceil^{th}$ column or the $\lfloor N/2 \rfloor^{th}$ column of the N columns of leading wires is located between two central columns of data lines in the M columns of data lines and electrically connected to a first row of the scan lines, and other leading wires on two sides of the $\lceil N/2 \rceil^{th}$ column or the $\lfloor N/2 \rfloor^{th}$ column of the N columns of leading wires are electrically connected to second through $N^{th}$ rows of the scan lines alternatively in sequence, respectively, wherein $\lceil N/2 \rceil$ represents a ceiling function that is equal to the mathematical result of N divided by 2 in a case that N is an even number and is equal to the first integer greater than the mathematical result of N divided by 2 in a case that N is an odd number, and $\lfloor N/2 \rfloor$ represents a floor function that is equal to the mathematical result of N divided by 2 in the case that N is an even number and is equal to the first integer smaller than the mathematical result of N divided by 2 in the case that N is an odd number; or
a first column of the N columns of leading wires is located between two columns of data lines on a first side of the M columns of data lines and electrically connected to a first row of the scan lines, and second through $N^{th}$ columns of the N columns of leading wires are connected to second through $N^{th}$ rows of the scan lines in sequence, respectively; or an $N^{th}$ column of the N columns of leading wires is located between two columns of data lines on a second side of the M columns of data lines and electrically connected to the first row of the scan lines, and the $(N-1)^{th}$ through first columns of the N columns of leading wires are connected to the second through $N^{th}$ rows of the scan lines in sequence, respectively.

9. The array substrate according to claim 2, wherein the N columns of leading wires are made from a metal material.

10. The array substrate according to claim 2, further comprising: a signal driving chip and a scan driving chip, wherein the signal driving chip is connected to the display array by the M columns of data lines and the scan driving chip is connected to the display array by the N columns of leading wires and the N rows of scan lines.

11. The array substrate according to claim 1, wherein the N columns of leading wires and the M columns of data lines are arranged in a common layer.

\* \* \* \* \*